US009753107B2

(12) United States Patent
Kwak et al.

(10) Patent No.: US 9,753,107 B2
(45) Date of Patent: Sep. 5, 2017

(54) MAGNETIC RESONANCE IMAGING (MRI) APPARATUS AND MANUFACTURING METHOD THEREOF

(71) Applicant: Samsung Electronics Co., Ltd., Gyeonggi-do (KR)

(72) Inventors: Jun Suk Kwak, Gyeonggi-do (KR); Sung Il Kim, Gyeonggi-do (KR); Seung Je Choi, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 1097 days.

(21) Appl. No.: 13/915,859

(22) Filed: Jun. 12, 2013

(65) Prior Publication Data

US 2014/0062484 A1     Mar. 6, 2014

(30) Foreign Application Priority Data

Sep. 5, 2012   (KR) ..................... 10-2012-0098186

(51) Int. Cl.
*G01R 33/38*     (2006.01)
*G01R 33/3873*   (2006.01)
*G01R 33/421*    (2006.01)

(52) U.S. Cl.
CPC ..... *G01R 33/3804* (2013.01); *G01R 33/3802* (2013.01); *G01R 33/3873* (2013.01); *G01R 33/4215* (2013.01); *Y10T 29/4902* (2015.01)

(58) Field of Classification Search
CPC ............ G01R 33/3804; G01R 33/3802; G01R 33/3873; G01R 33/4215; G01R 33/3856; Y10T 29/4902
See application file for complete search history.

(56) References Cited

U.S. PATENT DOCUMENTS

| 2008/0164876 A1* | 7/2008 | Sakakura | G01R 33/385 324/318 |
| 2008/0169813 A1* | 7/2008 | Yamashita | G01R 33/3856 324/321 |
| 2010/0085053 A1* | 4/2010 | Iwasa | G01R 33/3804 324/318 |
| 2010/0237867 A1* | 9/2010 | Slade | G01R 33/3873 324/314 |
| 2015/0048832 A1* | 2/2015 | Kwon | G01R 33/3804 324/322 |

(Continued)

FOREIGN PATENT DOCUMENTS

| CN | 1085767 A | 4/1994 |
| CN | 2542205 Y | 4/2003 |

(Continued)

OTHER PUBLICATIONS

Chinese Search Report dated Feb. 4, 2017.

*Primary Examiner* — Rodney Bonnette
(74) *Attorney, Agent, or Firm* — Cha & Reiter, LLC

(57) ABSTRACT

A magnetic resonance imaging (MRI) apparatus and method of manufacture including shims provided in outermost or an innermost part of a gradient coil unit. The MRI apparatus includes: a static coil unit configured to form a static field in a subject; and a gradient coil unit configured to form a gradient field in the static field, wherein the gradient coil unit includes one or more shims in an outermost part or an innermost part.

30 Claims, 22 Drawing Sheets

(56) References Cited

U.S. PATENT DOCUMENTS

2015/0168520 A1* 6/2015 Kwak ................ G01R 33/4215
　　　　　　　　　　　　　　　　　　　　　　324/318

FOREIGN PATENT DOCUMENTS

| CN | 101226232 A | 7/2008 |
| CN | 101484822 A | 7/2009 |
| CN | 101545959 A | 9/2009 |
| CN | 101916640 A | 12/2010 |
| CN | 102579047 A | 7/2012 |
| JP | 8-164118 A | 6/1996 |
| JP | 2005-125117 A | 5/2005 |
| JP | 2006-311957 A | 11/2006 |
| JP | 2008-183397 A | 8/2008 |
| JP | 2009-297060 A | 12/2009 |
| JP | 2012-11060 A | 1/2012 |
| JP | 2012-115474 A | 6/2012 |

* cited by examiner

MAGNETIC RESONANCE IMAGING (MRI) APPARATUS AND MANUFACTURING METHOD THEREOF

CLAIM OF PRIORITY

This application claims the benefit of priority from Korean Patent Application No. 2012-0098186, filed on Sep. 5, 2012 in the Korean Intellectual Property Office, the disclosure of which is incorporated herein by reference in its entirety.

BACKGROUND

1. Field of the Invention

The present disclosure relates to a magnetic resonance imaging (MRI) apparatus for diagnosing various diseases using MRI, and a manufacturing method thereof.

2. Description of the Related Art

In general, a medical imaging system is an apparatus that provides internal information about a patient as an image. Medical imaging systems include an X-ray machine, an ultrasonic diagnostic instrument, a computer tomography (CT) scanner, a magnetic resonance imaging (MRI) apparatus, etc.

The MRI apparatus holds an important position in the field of medical imaging diagnosis because image-taking conditions are relatively free and the MRI can provide excellent detectability and provide various diagnostic information images with respect to soft tissue.

The MRI causes nuclear magnetic resonance (NMR) in the hydrogen atomic nuclei of the human body using a magnetic field harmless to humans and RF which is non-ionizing radiation, to thus image the densities and physical or chemical characteristics of the atomic nuclei.

In more detail, the MRI apparatus supplies a specific frequency and energy to atomic nuclei in the state in which a constant magnetic field has been applied to the atomic nuclei, thereby causing the atomic nuclei to release energy, and converts the energy released from the atomic nuclei to signals, thereby diagnosing the inside human body.

When a magnetic field is applied to the atomic nuclei, protons configuring the atomic nuclei are arranged in the direction of the magnetic field since themselves have spin angular momentum and magnetic dipole moment, and the atomic nuclei perform precession with respect to the direction of the magnetic field. The precession causes nuclear magnetic resonance so that an internal image of the human body can be acquired through the nuclear magnetic resonance.

Meanwhile, the MRI apparatus applies a gradient field to a static field formed in a subject to thus acquire an image of the subject. Since a uniform static field should be formed in the subject, shims are provided for homogeneity of a static field formed by a static coil unit.

The shims may be provided inside the gradient coil unit forming gradient fields in a static field, or on the inner wall of the static coil unit.

Meanwhile, if passive shims are used, the passive shims are configured with tokens that can be comprised of iron and trays in which the iron tokens are accommodated. If current is applied to a gradient coil unit in order to form gradient fields in a static field formed in a subject, heat is generated by the resistance of the gradient coil unit.

The heat generation of the gradient coil unit may raise the temperature of the shim iron tokens, and if the temperature of the iron tokens is raised, homogeneity of the static field may deteriorate.

Accordingly, there is a need in the art for a technique capable of preventing the temperature of shim iron tokens from being raised such that the homogeneity of the static field deteriorates.

SUMMARY

Therefore, the present invention provides a magnetic resonance imaging (MRI) apparatus including shims provided in the most outer part of a gradient coil unit, and a manufacturing method thereof.

An aspect of the present invention provides a manufacturing method and magnetic resonance imaging (MRI) apparatus including shims provided in the most inner part of a gradient coil unit.

Additional aspects of the invention will be set forth in part in the description which follows and, in part, will be understood by a person of ordinary skill in the art from the description, or may be learned by practice of the invention.

In accordance with one aspect of the present invention, a magnetic resonance imaging (MRI) apparatus can include: a static coil unit configured to form a static field in a subject; and a gradient coil unit configured to form a gradient field in the static field, wherein the gradient coil unit includes one or more shims in an outermost part (e.g. an outer part).

The gradient coil unit can include: gradient coils configured to form the gradient field in the static field; and shield coils formed outside the gradient coils, and configured to compensate for influence of eddy current induced in the static coil unit by the gradient coils.

The shims may be positioned outside the shield coils, for example, in the gradient coil unit.

The MRI apparatus may further include a cooler formed between the shield coils and the shims, the cooler configured to prevent the temperature of the shims from being raised by heat transferred to the shims.

The shims may include: one or more shim trays configured for insertion into one or more shim inserting parts separately formed along the outer circumference direction of the gradient coil unit; and one or more iron tokens configured to be accommodated in the shim trays.

According to the present invention, at least one of the intervals between the shims may be different from the remaining intervals between the shims.

According to the present invention, at least one of the shim inserting parts can have a longer length in circumference direction of the section perpendicular to the central axis of the gradient coil unit, than a length in circumference direction of the section of a shim tray inserted into the corresponding shim inserting part.

In accordance with another aspect of the present invention, a magnetic resonance imaging (MRI) apparatus can include: a static coil unit configured to form a static field in a subject; and a gradient coil unit configured to form a gradient field in the static field, wherein the gradient coil unit includes one or more shims in an innermost part.

The gradient coil unit can include: gradient coils configured to form the gradient field in the static field; and shield coils formed outside the gradient coils, and configured to compensate for influence of eddy current induced in the static coil unit by the gradient coils.

The shims may be positioned inside the shield coils, in the gradient coil unit.

The MRI apparatus can further include a cooler formed between the gradient coils and the shims, the cooler configured to prevent the temperature of the shims from being raised by heat transferred to the shims.

The shims can include: one or more shim trays configured for insertion into one or more shim inserting parts separately formed along the inner circumference direction of the gradient coil unit; and one or more iron tokens configured to be accommodated in the shim trays.

According to the present invention, at least one of the intervals between the shims may be different from the remaining intervals.

At least one of the shim inserting parts may have a longer length in a circumference direction of the section perpendicular to the central axis of the gradient coil unit, than a length in circumference direction of the section of a shim tray inserted into the corresponding shim inserting part.

In accordance with another aspect of the present invention, a manufacturing method of a magnetic resonance imaging (MRI) apparatus can include: manufacturing a static coil unit; manufacturing a gradient coil unit by installing one or more shims in an outermost part of the gradient coil unit; and disposing the gradient coil unit inside the static coil unit.

The manufacturing of the gradient coil unit can include: forming gradient coils; forming shield coils outside the gradient coils; and forming the shims outside the shied coils.

The manufacturing method of the MRI apparatus may further include forming a cooler between the shield coils and the shims.

The forming of the shims can include forming one or more shim inserting parts separately along the outer circumference direction of the shield coils, outside the shield coils; and inserting the shims into the shim inserting parts.

The forming of the shim inserting parts can include forming the shim inserting parts such that at least one of intervals between the shim inserting parts is different from the remaining intervals.

The forming of the shim inserting parts can include forming the shim inserting parts such that a length in circumference direction of the section of at least one shim inserting part perpendicular to the central axis of the gradient coil unit is longer than a length in circumference direction of the section of a shim tray inserted into the corresponding shim inserting part.

In accordance with another aspect of the present invention, a manufacturing method of a magnetic resonance imaging (MRI) apparatus can include: manufacturing a static coil unit; manufacturing a gradient coil unit by installing one or more shims in the innermost part of the gradient coil unit; and disposing the gradient coil unit inside the static coil unit.

The manufacturing of the gradient coil unit can include: forming gradient coils; forming shield coils outside the gradient coils; and forming the shims inside the gradient coils.

The manufacturing method of the MRI apparatus can further include forming a cooler between the gradient coils and the shims.

The forming of the shims can include: forming one or more shim inserting parts separately along the inner circumference direction of the gradient coils, inside the gradient coils; and inserting the shims into the shim inserting parts.

The forming of the shim inserting parts can include forming the shim inserting parts such that at least one of intervals between the shim inserting parts is different from the remaining intervals.

The forming of the shim inserting parts can include forming the shim inserting parts such that a length in circumference direction of the section of at least one shim inserting part perpendicular to the central axis of the gradient coil unit is longer than a length in circumference direction of the section of a shim tray inserted into the corresponding shim inserting part.

According to an aspect of the present invention, by disposing shims in the outermost or innermost part of a gradient coil unit, heat generated from the gradient coil unit is transferred in one direction to iron tokens, and only a cooler for cooling the iron tokens is needed.

Also, the present invention provides advantages unknown in conventional structures and methods because only a cooler is disposed in the gradient coil unit, thereby permitting reduction in the thickness of the gradient coil unit, which increases a degree of freedom in designing of a MRI apparatus.

Also, by installing the shims in the outermost/innermost part of the gradient coil unit, influence of the Lorentz force is limited to one direction compared to when shims are installed between the innermost part and the outermost part of a gradient coil unit, which contributes to structural stability.

When shims are arranged conventionally between the innermost part and the outermost part of a gradient coil unit, shim trays are preferably arranged at regular intervals for structural stability of the gradient coil unit. However, by installing shims in the outermost/innermost part of a gradient coil unit, the shim trays do not need to be arranged at regular intervals for structural stability of the gradient coil unit, which advantageously contributes to an increase of a degree of freedom in arrangement of the shim trays, resulting in homogeneity of a static field.

BRIEF DESCRIPTION OF THE DRAWINGS

The aforementioned and/or other aspects of the invention will become apparent and more readily appreciated by a person of ordinary skill in the art from the following description of the exemplary embodiments of the invention, taken in conjunction with the accompanying drawings of which.

DETAILED DESCRIPTION

Figure 1:
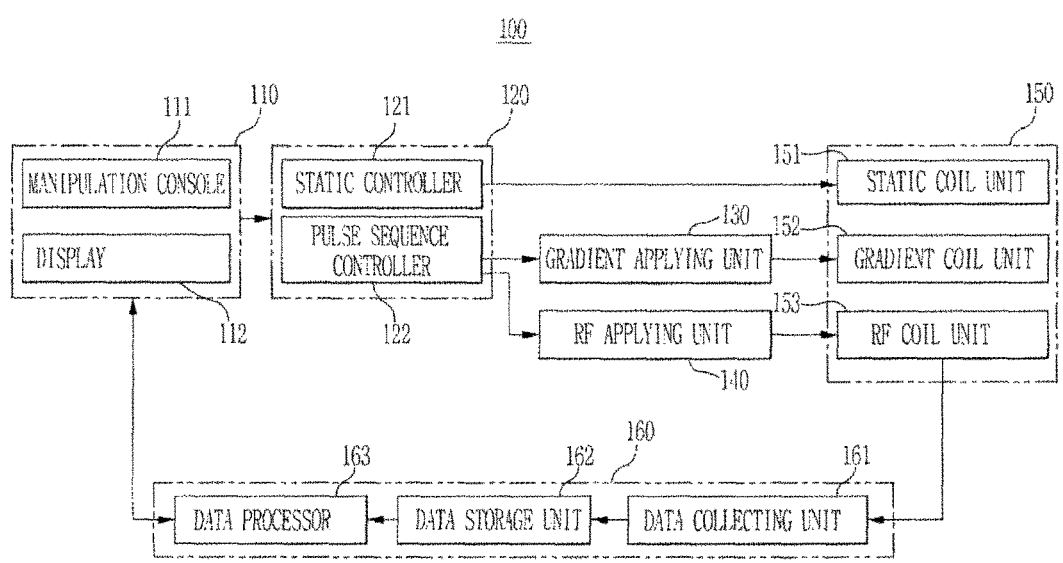
FIG. 1 is a control block diagram of a magnetic resonance imaging (MRI) apparatus in accordance with an exemplary embodiment of the present invention.

Reference will now be made in more detail to the exemplary embodiments of the present invention, examples of which are illustrated in the accompanying drawings, wherein like reference numerals refer to like elements throughout.

FIG. 1 is a control block diagram of a magnetic resonance imaging (MRI) apparatus 100 in accordance with an exemplary embodiment of the present invention.

Referring now to FIG. 1, the MRI apparatus 100 in accordance with this exemplary embodiment of the present invention includes a magnet assembly 150 for forming a magnetic field to cause resonance in atomic nuclei, a controller 120 for controlling the operation of the magnet assembly 150, and an image processor 160 for receiving an echo signal generated from the atomic nuclei to create a magnetic resonance image.

The magnet assembly 150 includes a static coil unit 151 for forming a static field therein, a gradient coil unit 152 for forming a gradient field in the static field, and an RF coil unit 153 for applying an RF pulse to excite atomic nuclei and receiving an echo signal from the atomic nuclei.

With continued reference to FIG. 1, the controller 120 includes a static controller 121 for controlling the strength and direction of a static field that is formed by the static coil unit 151, and a pulse sequence controller 122 for designing a pulse sequence and controlling the gradient coil unit 152 and the RF coil unit 153 according to the pulse sequence.

Also, the MRI apparatus 100 includes a gradient applying unit 130 for applying a gradient signal to the gradient coil unit 152, and a RF applying unit 140 for applying (generating and outputting) an RF signal to the RF coil unit 153, so that the pulse sequence controller 122 controls the gradient applying unit 130 and the RF applying unit 140 to adjust a gradient field that is formed in a static field and RF that is applied to atomic nuclei.

In addition, the MRI apparatus 100 can include a user manipulation unit 110 that receives a control command regarding the operation of the MRI apparatus 100 from a user. More particularly, the user manipulation unit 110 can receive a command regarding a scan sequence from a user to create a pulse sequence according to the command.

Figure 2:
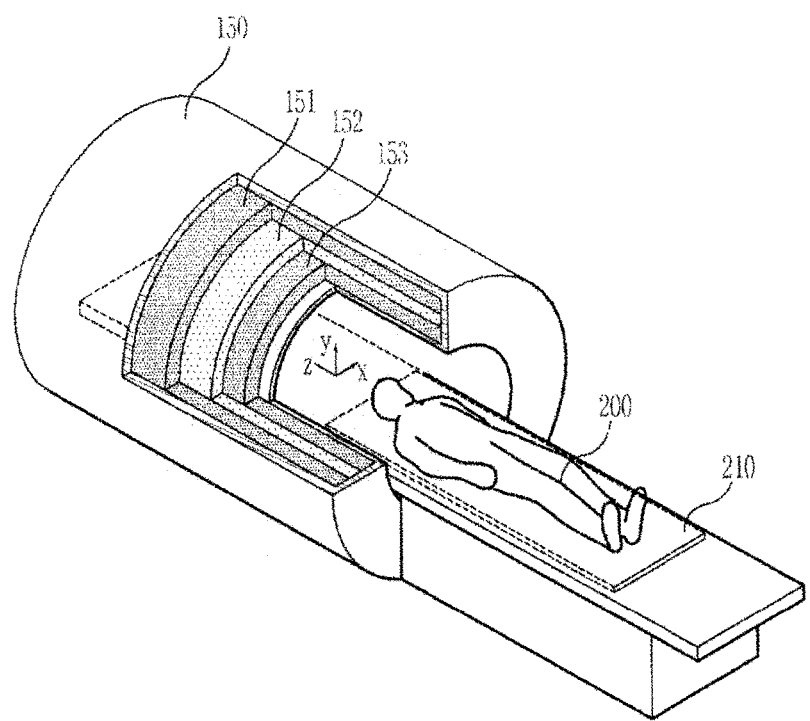
FIG. 2 schematically shows cut-away portion of a perspective view of the MRI apparatus according to an exemplary embodiment of the present invention.

The user manipulation unit 110 can include a manipulation console 111 for allowing a user to manipulate the MRI apparatus 100, and a display 112 for displaying a control state and displaying an image created by the image processor 160 in order for the user to diagnose the health state of a subject 200 (shown in FIG. 2).

Figure 3:
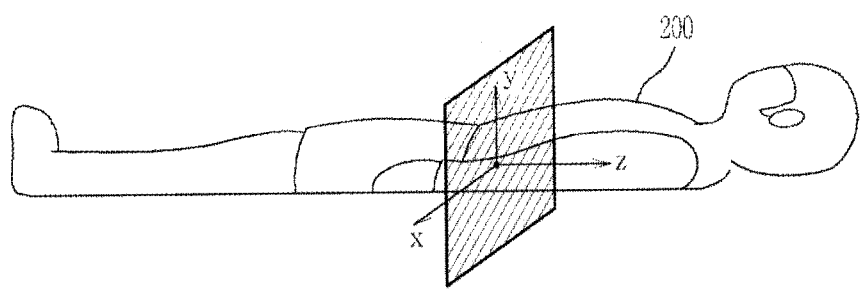
FIG. 3 shows a subject lying in a space divided into x, y, and z axes.
Figure 4:
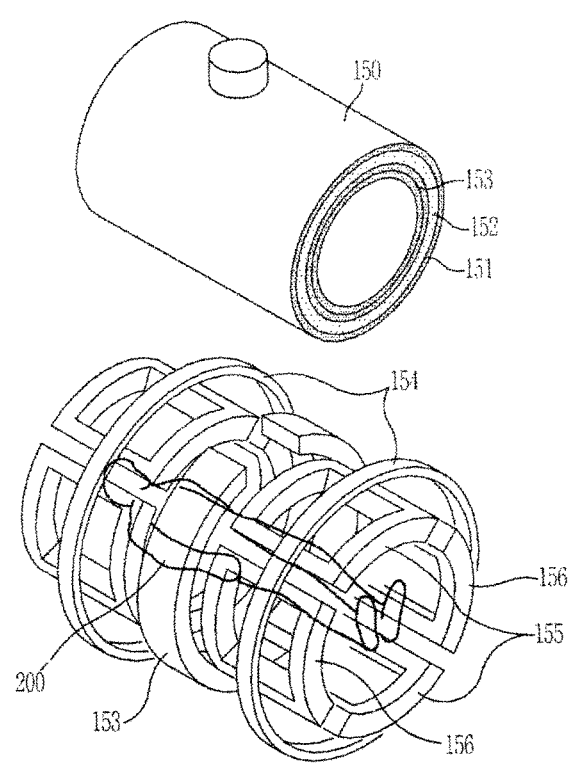
FIG. 4 shows the structures of a magnet assembly and a gradient coil unit.
Figure 5:
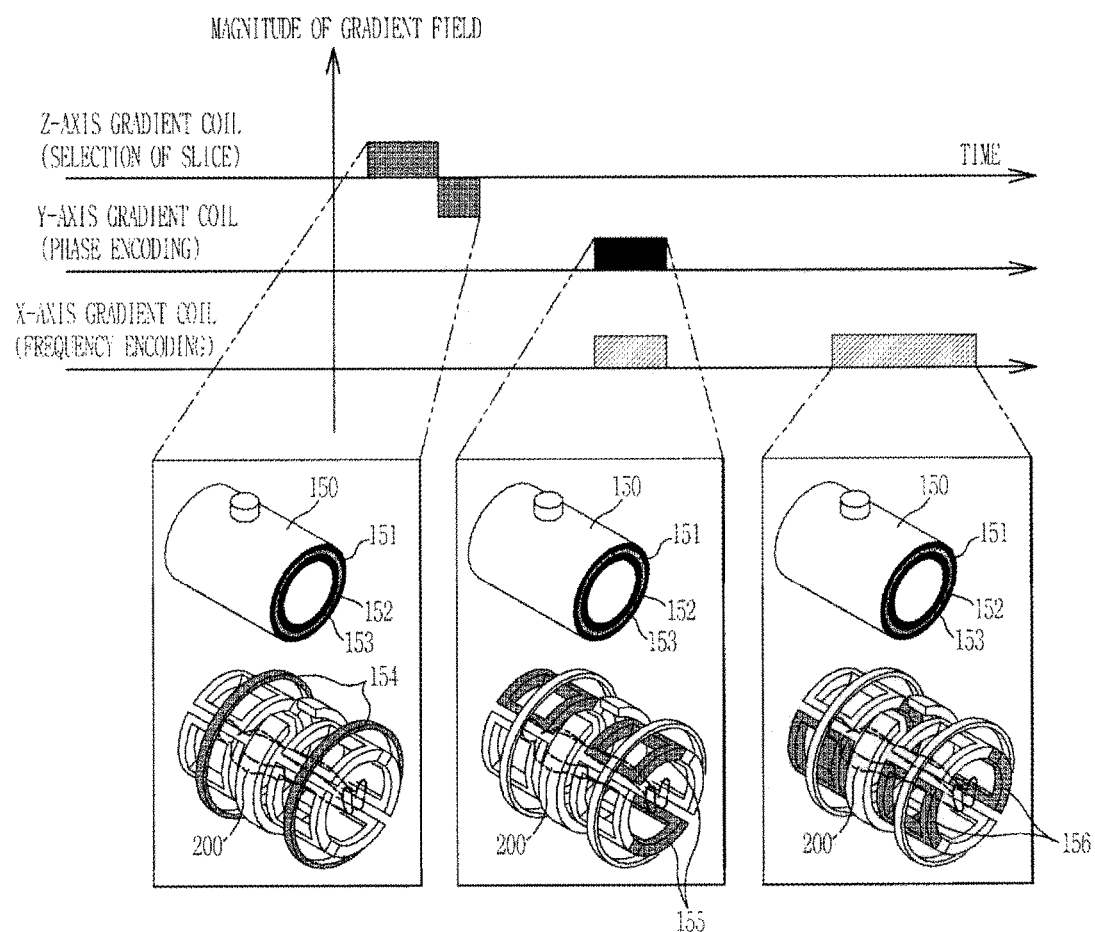
FIG. 5 shows individual gradient coils configuring the gradient coil unit and pulse sequences related to operation of the individual gradient coils.

FIG. 2 shows a cut-away portion of a perspective view of the MRI apparatus 100; FIG. 3 shows the subject 200 lying in a space divided to x, y, and z axes; FIG. 4 shows the structures of the magnet assembly 150 and the gradient coil unit 152; and FIG. 5 shows individual gradient coils configuring the gradient coil unit 152 and pulse sequences related to operation of the individual gradient coils.

Hereinafter, the operation of the MRI apparatus 100 will be described in detail with reference to FIGS. 1 through 5.

The magnet assembly 150 is typically formed in the shape of a hollow cylinder, and the inside space of the magnet assembly 150 is referred to as cavity. A transfer unit 210 moves the subject 200 lying thereon to the cavity in order to obtain a magnetic resonance signal.

The magnet assembly 150 includes, as described above, the static coil unit 151, the gradient coil unit 152, and the RF coil unit 153.

The static coil unit 151 can have a structure in which coils are wound around the cavity, and if a current is applied to the static coil unit 151, a static field is formed inside the magnet assembly 150, that is, in the cavity.

The direction of the static field is generally parallel to the concentric axis of the magnet assembly 150.

If the static field is formed in the cavity, the atomic nuclei of atoms (specifically, hydrogen atoms) configuring the subject 200 are arranged in the direction of the static field, and perform precession with respect to the direction of the static field. The precession speed of the atomic nuclei may be expressed as a precession frequency, which is called a Larmor frequency, and may be represented by equation 1, below.

$$\omega = \gamma B_0, \quad (1)$$

where $\omega$ is the Larmor frequency, $\gamma$ is a proportional constant, and $B_0$ is the strength of an external magnetic field. The proportional constant depends on the kind of atomic nuclei, and the strength of the external magnetic field is measured in units of Tesla (T) or Gauss (G), and the precession frequency is measured in units of Hz.

For example, hydrogen protons have a precession frequency of 42.58 MHz in an external magnetic field of 1 T. As hydrogen atoms constitute a main portion of atoms configuring the human body, the MRI acquires a magnetic resonance signal using the precession of hydrogen protons.

The gradient coil unit 152 generates a gradient in the static field formed in the cavity to form a gradient field.

As shown in FIG. 3, an axis parallel to the up and down direction from head to feet of the subject 200 while lying down, that is, an axis parallel to the direction of the static field may be decided as the z-axis, an axis parallel to the left and right direction of the subject 200 may be decided as the x-axis, and an axis parallel to the up and down direction in the 3-dimensional (3D) space may be decided as the y-axis.

In order to obtain 3D spatial information, gradient fields with respect to all of the x-, y-, and z-axes are required. Accordingly, the gradient coil unit 152 includes three pairs of gradient coils.

As shown in FIGS. 4 and 5, the z-axis gradient coils 154 are configured with a pair of ring-shaped coils, and the y-axis gradient coils 155 are positioned above and below the subject 200. Also, the x-axis gradient coils 156 are positioned in the left and right sides of the subject 200.

If direct currents having opposite polarities flow through the respective z-axis gradient coils 154, a change of a magnetic field in the z-axis direction occurs so that a gradient field is formed. FIG. 5 shows a pulse sequence corresponding to a z-axis gradient field formed when the z-axis gradient coils 154 are operational.

Since the greater gradient of the gradient field formed in the z-axis direction enables selection of a thinner slice, the z-axis gradient coils 154 are used to select a slice.

If a slice is selected through the gradient field formed by the z-axis gradient coils 154, spins configuring the corresponding slice have the same frequency and phase, so that the individual spins cannot be distinguished from each other. In this state, if a gradient field in the y-axis direction is formed by the y-axis gradient coils 155, the y-axis gradient field causes a phase shift such that the rows of the slice have different phases.

In other words, if the y-axis gradient field is formed, the phases of the spins of rows to which the greater gradient field has been applied change to the higher frequencies, and the phases of the spins of rows to which the smaller gradient field has been applied change to the lower frequencies. Thereafter, if the y-axis gradient field disappears, a phase shift occurs in the individual rows of the selected slice so as for the rows to have different phases, so that the rows can be distinguished from each other. As such, the gradient field formed by the y-axis gradient coils 155 is used for phase encoding. FIG. 5 also shows a pulse sequence corresponding to the y-axis gradient field formed when the y-axis gradient coils 155 operate.

In summary, with reference to FIG. 5, a slice is selected through the gradient field formed by the z-axis gradient coils 154, and rows configuring the selected slice are distinguished in such a manner to have different phases through the gradient field formed by the y-axis gradient coils 155. However, spins configuring each row still cannot be distinguished since they have the same frequency and phase. In this state where spins configuring each row still cannot be distinguished since they have the same frequency and phase, if a gradient field in the x-axis direction is formed by the x-axis gradient coils 156, the x-axis gradient field causes spins configuring each row to have different frequencies such that the spins can be distinguished from each other. As such, the gradient field formed by the x-axis gradient coils 156 is used for frequency encoding.

As described above, the gradient fields respectively formed by the z-, y-, and x-axis gradient coils spatially encode the spatial locations of individual spins through slice selection, phase encoding, and frequency encoding.

With further reference to FIGS. 4 and 5, the gradient coil unit 152 is connected to the gradient applying unit 130, and the gradient applying unit 130 applies a driving signal to the gradient coil unit 152 according to a control signal received from the pulse sequence controller 122 to generate gradient fields. The gradient applying unit 130 may include three driving circuits in correspondence to three types of gradient coils 154, 155, and 156 configuring the gradient coil unit 152.

As described above, atomic nuclei arranged by an external magnetic field perform precession at the Larmor frequency, and a sum of magnetization vectors of some atomic nuclei may be represented as net magnetization M.

The z-axis component of the net magnetization M cannot be measured, and only $M_{xy}$ can be detected. Accordingly, in order to obtain a magnetic resonance signal, the atomic nuclei should be excited so that net magnetization M exists on the xy plane. For excitation of atomic nuclei, it is necessary to apply an RF pulse tuned to the Larmor frequency of the atomic nuclei to the static field.

The RF coil unit 153 includes a transmission coil for transmitting the RF pulse, and a reception coil for receiving electromagnetic waves, in other words, a magnetic resonance signal released from excited atomic nuclei.

The RF coil unit 153 is connected to the RF applying unit 140 (shown in FIG. 1), and the RF applying unit 140 applies a driving signal to the RF coil unit 153 according to a control signal received from the pulse sequence controller 122 so that the RF coil unit 153 transmits the RF pulse.

The RF applying unit 140 can include a modulation circuit for modulating a high frequency output signal to a pulse type signal, and a RF power amplifier for amplifying the pulse type signal.

Also, the RF coil unit 153 is connected to the image processor 160, and as shown in FIG. 1, the image processor 160 can include a data collecting unit 161 for receiving data regarding a magnetic resonance signal generated from atomic nuclei, and a data processor 163 for processing data collected by the data collecting unit 161 to create a magnetic resonance image.

With further regard to the image processor 160 as shown in FIG. 1. the data collecting unit 161 comprises hardware including a preamplifier for amplifying the magnetic resonance signal received by the reception coil of the RF coil unit 153, a phase detector for receiving the magnetic resonance signal from the preamplifier to detect the phase of the magnetic resonance signal, and an A/D converter for converting the analog signal acquired by the phase detection to a digital signal. Also, the data collecting unit 161 transmits the digitalized magnetic resonance signal to a data storage unit 162.

In the data storage unit 162, which comprises a machine readable storage medium, a data space configuring a 2D Fourier space is formed, and after scanned data is all stored in the data storage unit 162, the data processor 163 performs 2D Inverse-Fourier Transform on data in the 2D Fourier space to reconfigure an image about the subject 200. The reconfigured image is displayed on the display 112.

As a method for acquiring a magnetic resonance signal from atomic nuclei, a spin echo pulse sequence has been widely used. If the RF coil unit 153 sequentially applies two RF pulses with a predetermined time interval Δt in between, strong transverse magnetization occurs in atomic nuclei when the time interval Δt has again elapsed, and a magnetic resonance signal may be acquired through the strong transverse magnetization. This method is called a spin echo pulse sequence. A time period taken until the magnetic resonance signal is generated from when the first RF pulse has been applied is time echo (TE).

A degree at which protons have been flipped may be represented as an angle at which the protons have moved away from an axis on which they have been positioned before being flipped, and the corresponding RF pulse may be represented, for example, as a 90° RF pulse, a 180° RF pulse, etc., according to the degree of flip.

Figure 6:
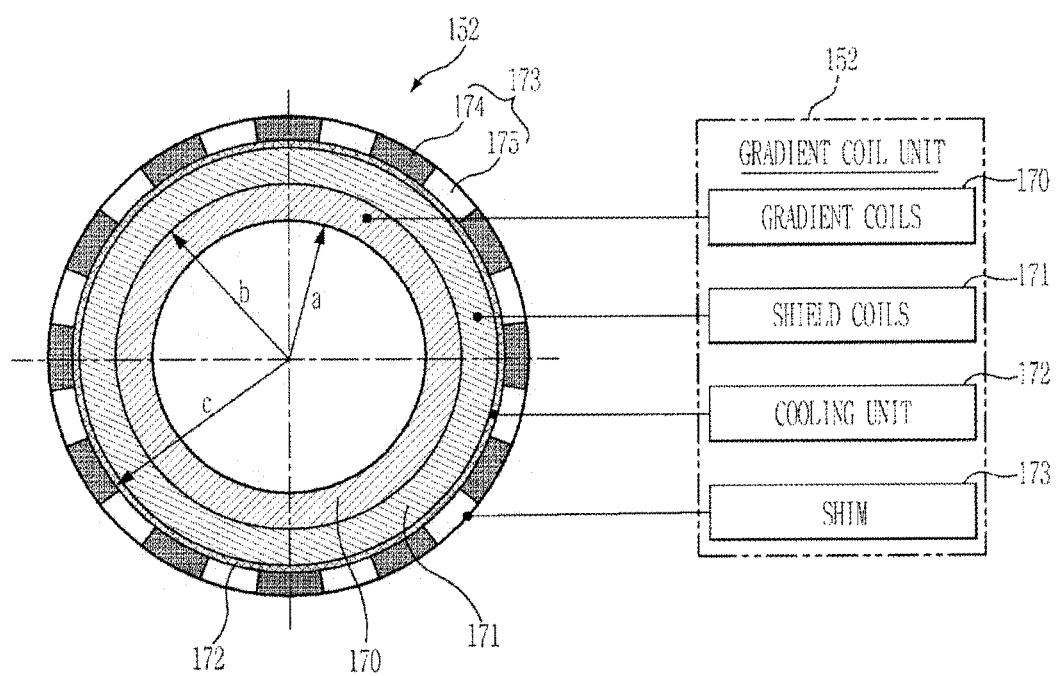
FIGS. 6, 7, and 8 are cross-sectional views conceptually showing the structure of a gradient coil unit of a MRI apparatus in accordance with an exemplary embodiment of the present invention.
Figure 7:
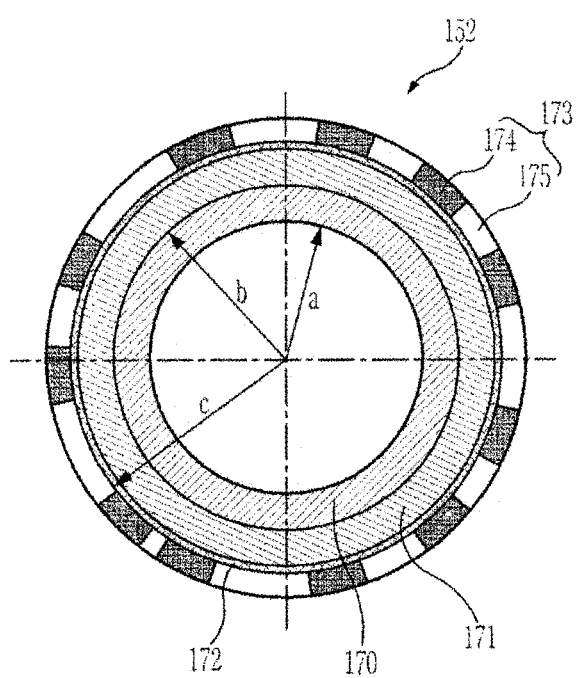
Figure 8:
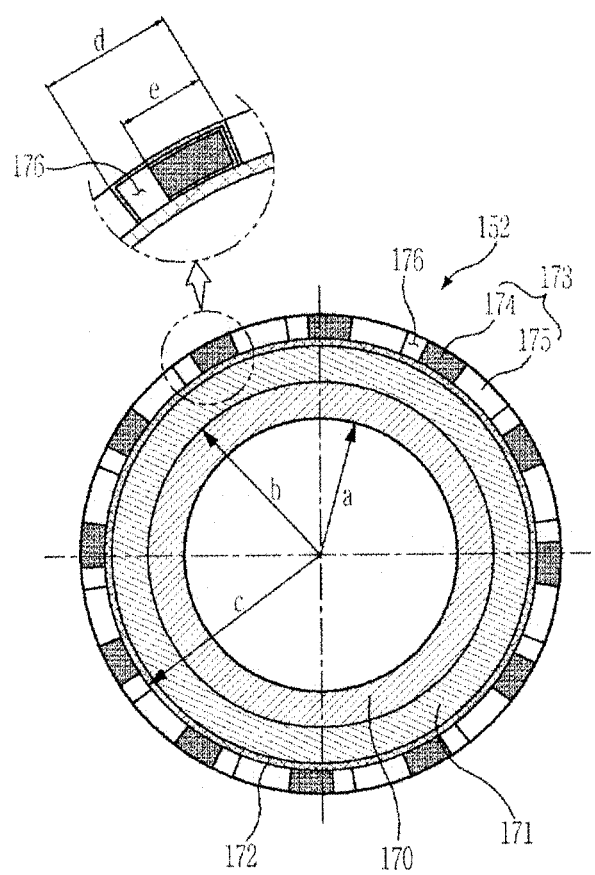
Figure 9:
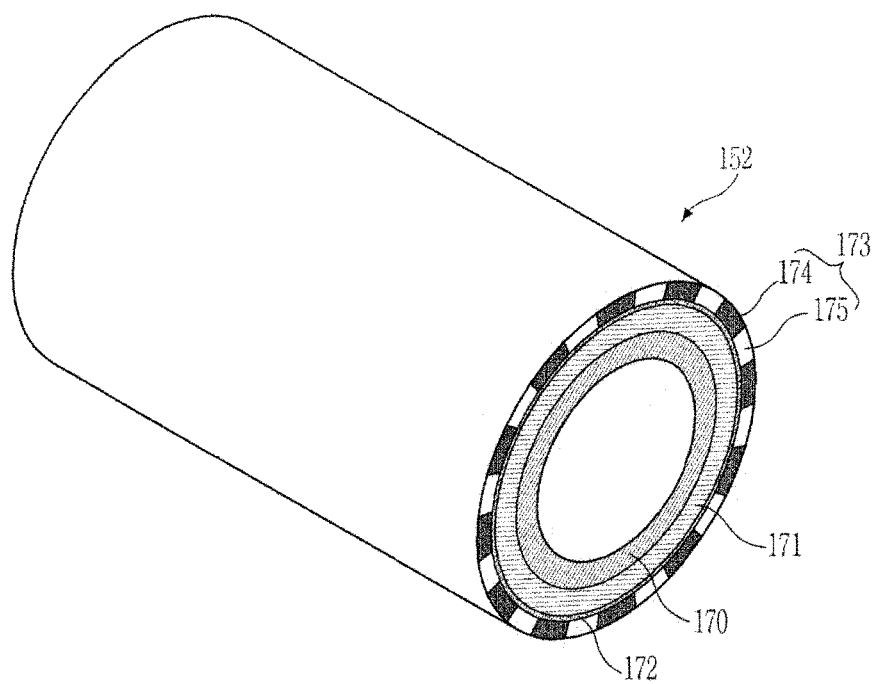
FIGS. 9, 10, and 11 are perspective views conceptually showing the structure of the gradient coil unit.
Figure 10:
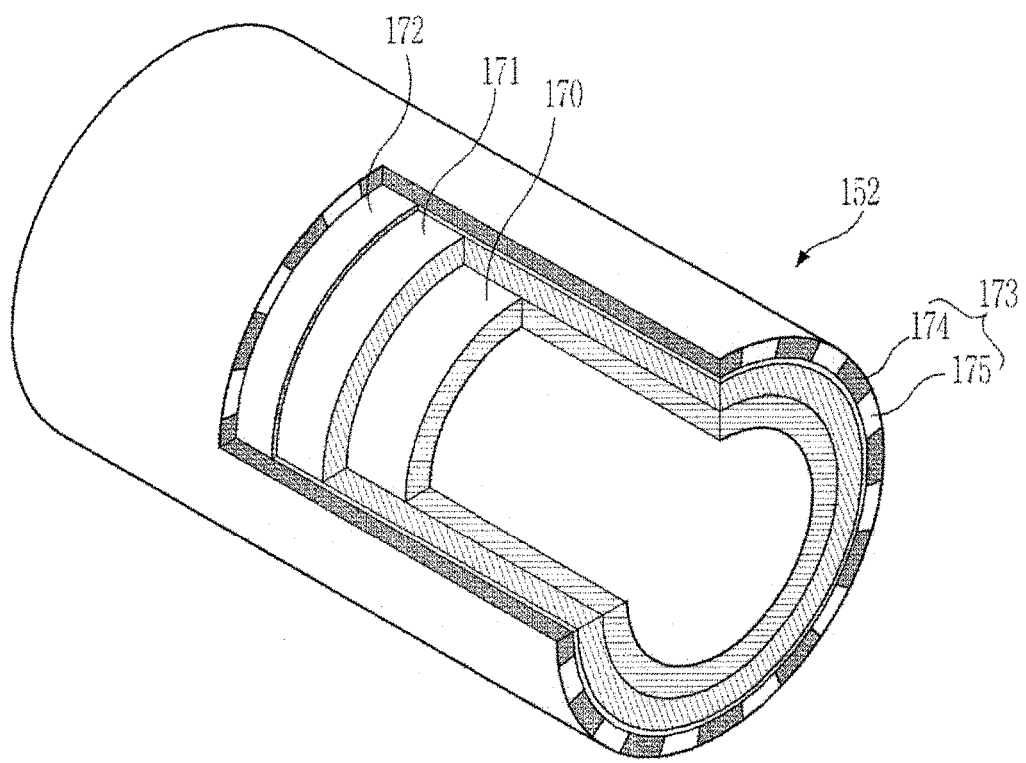
Figure 11:
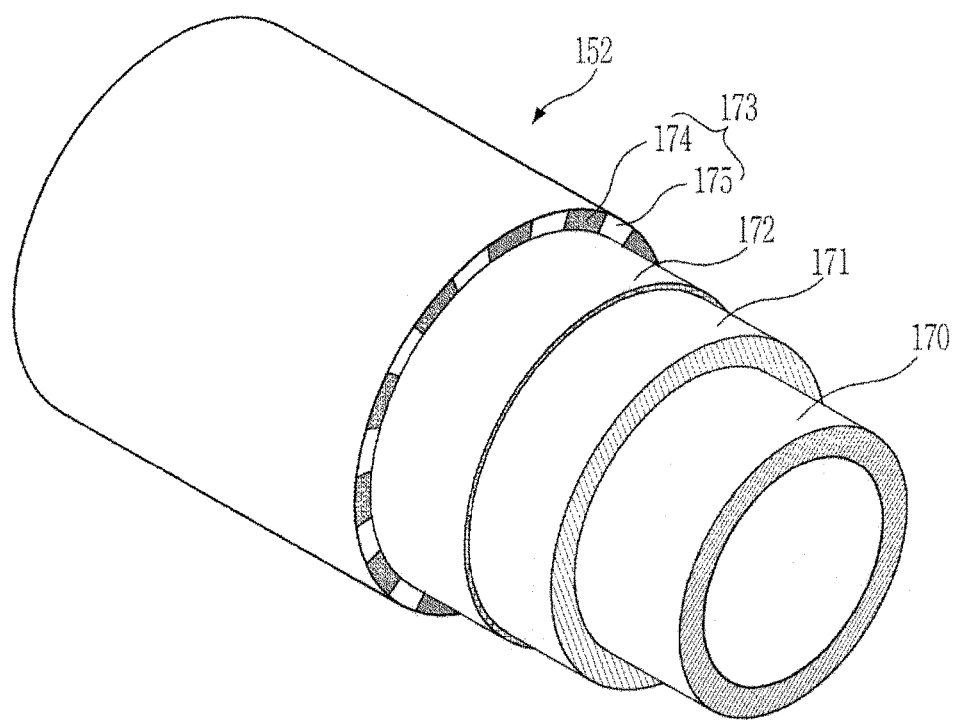

FIGS. 6, 7, and 8 are cross-sectional views conceptually showing the structure of a gradient coil unit 152 of a MRI apparatus such as shown in FIG. 9 in accordance with an exemplary embodiment of the present invention, and FIGS. 9, 10, and 11 are perspective views conceptually showing the structure of the gradient coil unit 152.

The gradient coil unit 152 applies gradients to a static field formed in cavity to form gradient fields.

As described above, in order to obtain 3D spatial information, gradient fields with respect to all of x-, y-, and z-axes are required, and accordingly, the gradient coil unit 152 includes three pairs of gradient coils.

As shown in FIGS. 4 and 5, z-axis gradient coils 154 is configured with a pair of ring-shaped coils, and y-axis gradient coils 155 are positioned above and below the subject 200. Also, x-axis gradient coils 156 are positioned in the left and right sides of the subject 200. Hereinafter, the x-, y-, and z-axis gradient coils will be referred to as gradient coils 170.

The gradient coil unit 152 includes shield coils 171 that are disposed outside the gradient coils 170.

As shown in the drawings, since the shield coils 171 are disposed outside the gradient coils 170, the installation radius of the shield coils 171 is larger than that of the gradient coils 170.

If a strong pulse of current is applied to the gradient coils 170, eddy current flows through a static coil unit surrounding the gradient coils 170 in a direction in which generation of gradient fields are suppressed.

If the eddy current is induced in the static coil unit, the linearity of gradient fields deteriorates in the time-axis direction. If there is eddy current in a gradient field for slice selection, a slice profile is degraded, resulting in deterioration of a signal-to-noise ratio (SNR).

Meanwhile, if there is eddy current in a gradient field for frequency encoding, non-uniform standardization is performed in k-space in the direction of frequency encoding, which degrades resolution of images, and causes the generation of ringing at borders and blur due to the degraded resolution. The degree of the influence of eddy current depends on respective imaging methods, and the influence is significant in gradient field echo images and high-speed images.

In order to overcome the problem due to eddy current, as shown in FIG. 6 the shield coils 171 are installed outside the gradient coils 170. In order to cancel the strength of gradient fields extending out of the gradient coils 170 to thus reduce the amount of eddy current, current whose direction is opposite to that of current applied to the gradient coils 170 is applied to the shield coils 171.

The MRI apparatus provides shims 173 in the gradient coil unit 152 in order to uniformly distribute a static field that is formed by the static coil unit.

As shown in FIG. 6, the shims 173 are installed in the most outer part of the gradient coil unit 152. In other words, the installation radius of the shims 173 is larger than the installation radius of the shield coils 171. There are active shims and passive shims, and in the current exemplary embodiment, passive shims are used.

The shims 173 are configured with iron tokens for homogeneity of a static field, and shim trays 174 in which the iron tokens are accommodated. The shim trays 174 have a length corresponding to the length in z-axis direction of the gradient coil unit 152 which is in the shape of a cylinder, and the inner space of each shim tray 174 may be partitioned into a plurality of spaces according to the sizes of iron tokens so that a plurality of iron tokens can be accommodated in the shim tray 174.

The shim trays 174 are installed by being inserted into shim inserting parts 176 separately provided along the outer circumference direction of the gradient coil unit 152.

A basic principle in which the shims 173 uniformly form a static field is well-known in the art, and accordingly, a detailed description thereof will be omitted.

If current is applied to the gradient coils 170 or the shield coils 171, there is heat generated due to resistance of the coils, and the generated heat raises the temperature of the shim iron tokens.

Since a change in temperature of the iron tokens acts as a factor of changing the homogeneity of a static field, there is a need for a cooler (cooling unit) 172 for cooling heat to be transferred to the iron tokens is provided to prevent the temperature of the iron tokens from being raised.

In the conventional art, the shims would be installed between the gradient coils and the shield coils of the gradient coil unit. However, in such as conventional case, since heat generated from the gradient coils 170 and the shield coils 171 is transferred to the shims 173 in both directions, two coolers should be installed in such a way that one is installed adjacent to the gradient coils 170 and another is installed adjacent to the shield coils 171 because the shims are receiving the transference of heat in two directions.

As such, if two coolers are installed, the section thickness of the gradient coil unit 152 increases, which limits a design degree of freedom.

The spaces between the shim trays 174 are filled with resin such as epoxy, and the resin acts as pillars supporting the gradient coils 170 and the shield coils 171. However, the Lorentz force is applied to the resin filled in the spaces between the shim trays 174 according to flow of current in the gradient coils 170 and the shield coils 171, so that a problem of structural instability may occur.

In other words, if the shims 173 were installed between the gradient coils 170 and the shield coils 171, the section thickness of the gradient coil unit 152 would be thickened, and also a problem of structural instability would occur.

Accordingly, in the gradient coil unit 152 of the MRI apparatus according to the present exemplary embodiment, by installing shims 173 in the most outer part of the gradient coil unit 152, the above-described problems are overcome.

If the shims 173 are installed in the most outer part of the gradient coil unit 152, heat is transferred in one direction to the shim iron tokens. That is, a direction in which heat is transferred to the iron tokens is limited to the direction from the center of the cylinder to the outside.

As a result, since heat is transferred in one direction, only a single cooler 172 is needed between the shield coils 171 and the shims 173, thus resulting in a thinner design.

FIG. 6 shows the case in which the cooler 172 has been installed between the shield coils 171 and the shims 173. The cooler 172 may use various well-known cooling methods.

Since only a single cooler 172 is needed by installing the shims 173 in the most outer part of the gradient coil unit 152, the section thickness of the gradient coil unit 152 becomes thinner than that of when two coolers are used.

The reduced thickness may contribute to an increase of a degree of freedom in manufacturing of the gradient coil unit 152 and in designing and manufacturing of the MRI apparatus.

Also, by installing the shims 173 in the most outer part of the gradient coil unit 152, influence of the Lorentz force is limited to one direction compared to when the shims 173 are installed between the gradient coils 170 and the shield coils 171, which contributes to structural stability.

Also, when the shims 173 are installed between the gradient coils 170 and the shield coils 171, the shim inserting parts 176 into which the shim trays 174 are inserted for structural stability of the gradient coil unit 152 should be arranged at regular intervals. As described above, since the resin between the shim inserting parts 176 acts as pillars supporting the gradient coils 170 and the shield coils 171, the shim inserting parts 176 should be formed at regular intervals for structural stability of the gradient coil unit 152. However, if the shims are installed in the outermost part of the gradient coil unit 152, like the present exemplary embodiment, it is not required to arrange the shim inserting parts 176 at regular intervals for structural stability. Accordingly, the shim inserting parts 176 may be arranged at irregular intervals (175) as shown in FIG. 7. Advantageously, if the intervals between the shims 173 can be freely designed (irregular intervals), the static field can be finely adjusted.

FIG. 8 shows another exemplary embodiment of the present invention.

Referring now to FIG. 8, the width "d" of the shim inserting parts 176 may be designed to be wider than the width "e" of the shim trays 174 that are inserted into the shim inserting parts 176 so that the shim trays 174 inserted into the shim inserting parts 176 can move in the width direction.

In other words, by enabling the shim trays 174 to move in some degree in the circumferential direction, while uniformly forming a static field by adjusting the number or arrangement of iron tokens accommodated in the shim trays 174, high homogeneity of the static field can be achieved.

FIG. 9 is a perspective view that 3-dimensionally illustrates the gradient coil unit 152 shown in FIG. 6, FIG. 10 is a perspective view showing the internal structure of the gradient coil unit 152, and FIG. 11 is a perspective view for showing that the individual components of the gradient coil unit 152 have different radiuses of cylinder structures.

Referring now to FIGS. 10 and 11, the gradient coil unit 152 includes gradient coils 170 positioned in the innermost inner part and as shown in FIG. 8 having an installation radius "a", shield coils 171 surrounding the gradient coils 170 and having an installation radius "b" longer than the installation radius "a" of the gradient coils 170, and shims 173 surrounding the shield coils 171 and having an installation radius "c" longer than the installation radius "b" of the shield coils 171. Also, a cooler 172 is positioned between the shield coils 171 and the shims 173 in order to prevent the temperature of the shim iron tokens from being raised, (or raised beyond a threshold temperature).

Figure 12:
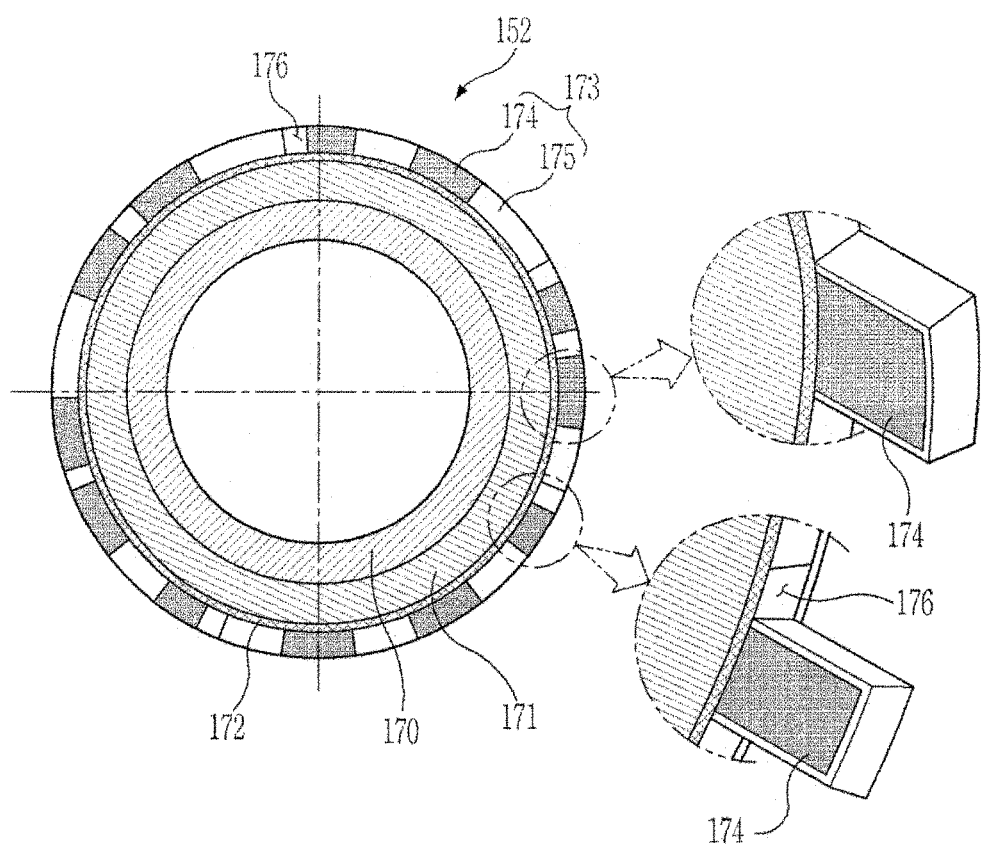
FIG. 12 is a perspective view conceptually showing shims of the gradient coil unit and the structure of a cooling unit.

FIG. 12 shows the shims 173 and the cooler 172 in detail.

Referring now to FIG. 12, it is seen that the cooler 172 is installed in contact with the inner surfaces of the shims 173. Since the shims 173 are disposed in the outermost part of the gradient coil unit 152 so that a direction in which heat generated from the gradient coils 170 and the shield coils 171 is transferred is limited to the direction from the center of the cylinder toward the outside, such that a cooler 172 can be provided only on the inner surfaces of the shims 173.

The shims 173 shown in FIG. 12 may be arranged as shown in FIGS. 6, 7, and 8. In other words, while some of the shims 173 can be arranged at regular intervals, some others of the shims 173 can be arranged at irregular intervals, and in some shims 173, the widths of the corresponding shim inserting parts 176 may be wider than those of the corresponding shim trays 174.

As shown in an enlarged part corresponding to one of the shims arranged at regular intervals, among enlarged parts of FIG. 12, each shim 173 is configured with a drawer-type shim tray 174 that is inserted into the corresponding shim inserting part 176, and one or more iron tokens (not shown) that are accommodated into the shim tray 174. The number or arrangement of the iron tokens that are accommodated into the shim tray 174 is determined according to results calculated for homogeneity of the static field.

The other enlarged part shows an area in which the width of the shim inserting part 176 is wider than that of the corresponding shim tray 174. As described above, if the widths "d" of shim inserting parts 176 are designed to be wider than the widths "e" of the corresponding shim trays 174, the shim trays 174 inserted into the shim inserting parts 176 may move in the width direction. Accordingly, by enabling the shim trays 174 to move in some degree in the circumferential direction, while uniformly forming a static field by adjusting the number or arrangement of iron tokens accommodated in the shim trays 174, high homogeneity of the static field can be achieved.

Figure 13:
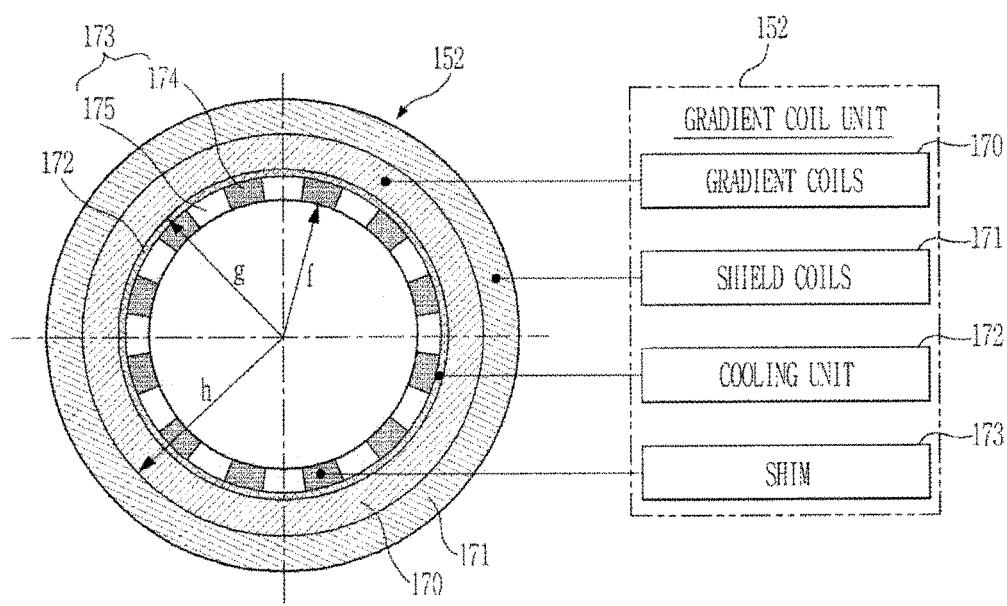
FIGS. 13, 14, and 15 are cross-sectional views conceptually showing the structure of a gradient coil unit of a MRI apparatus according to another exemplary embodiment of the present invention.
Figure 14:
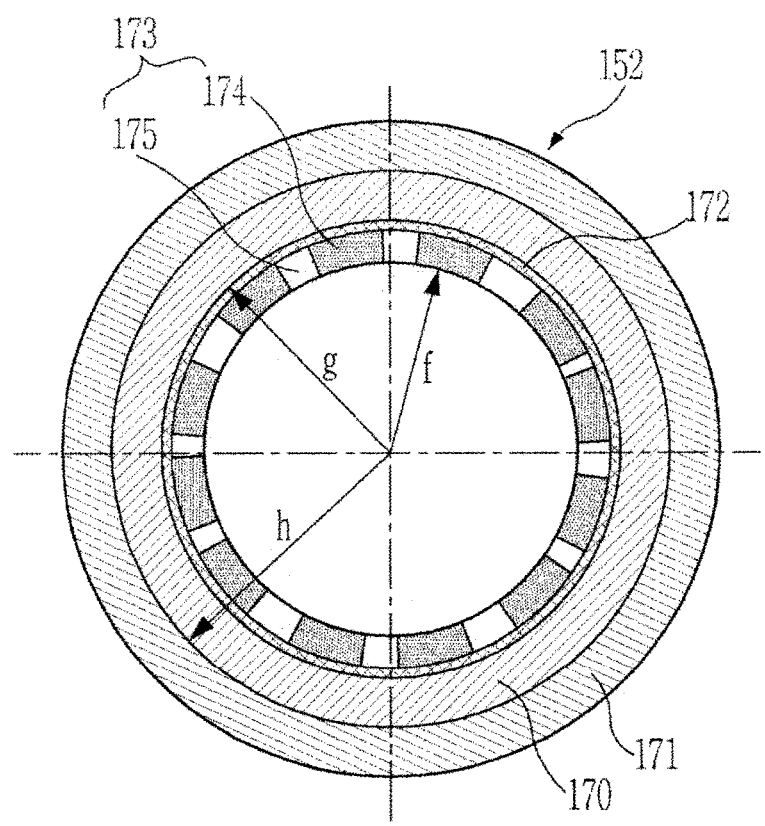
Figure 15:
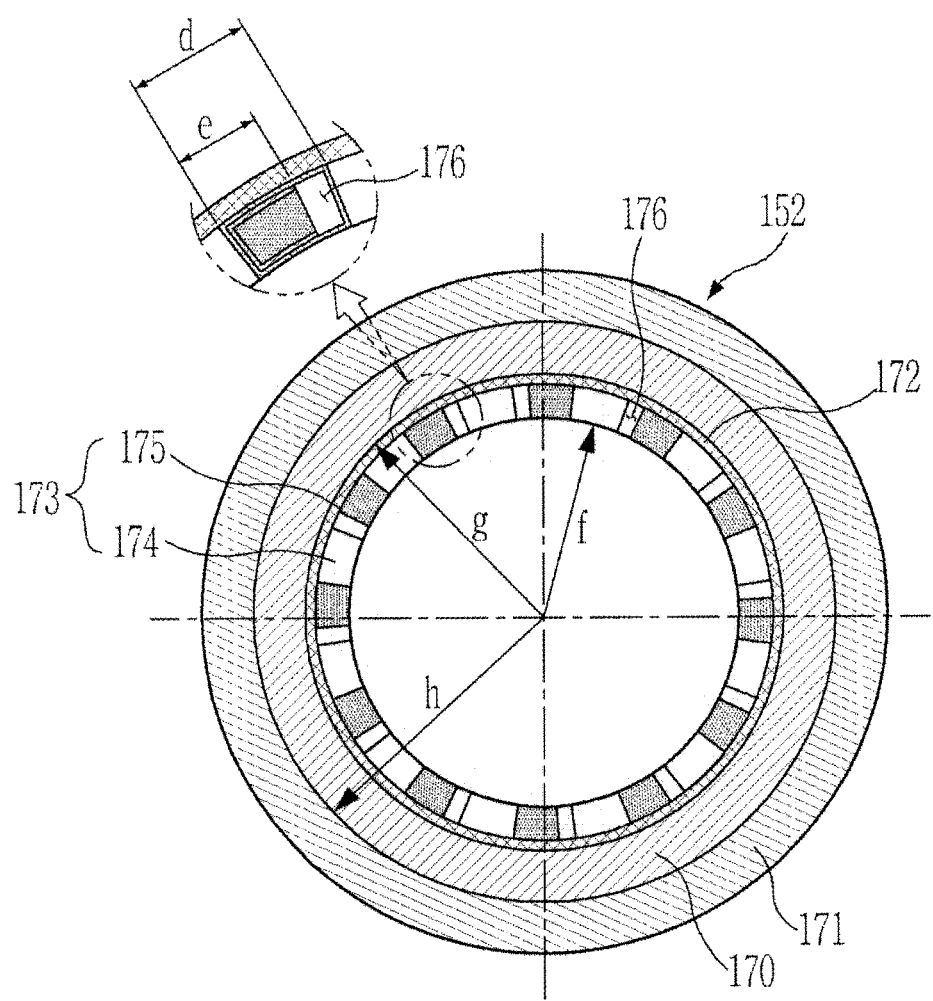
Figure 16:
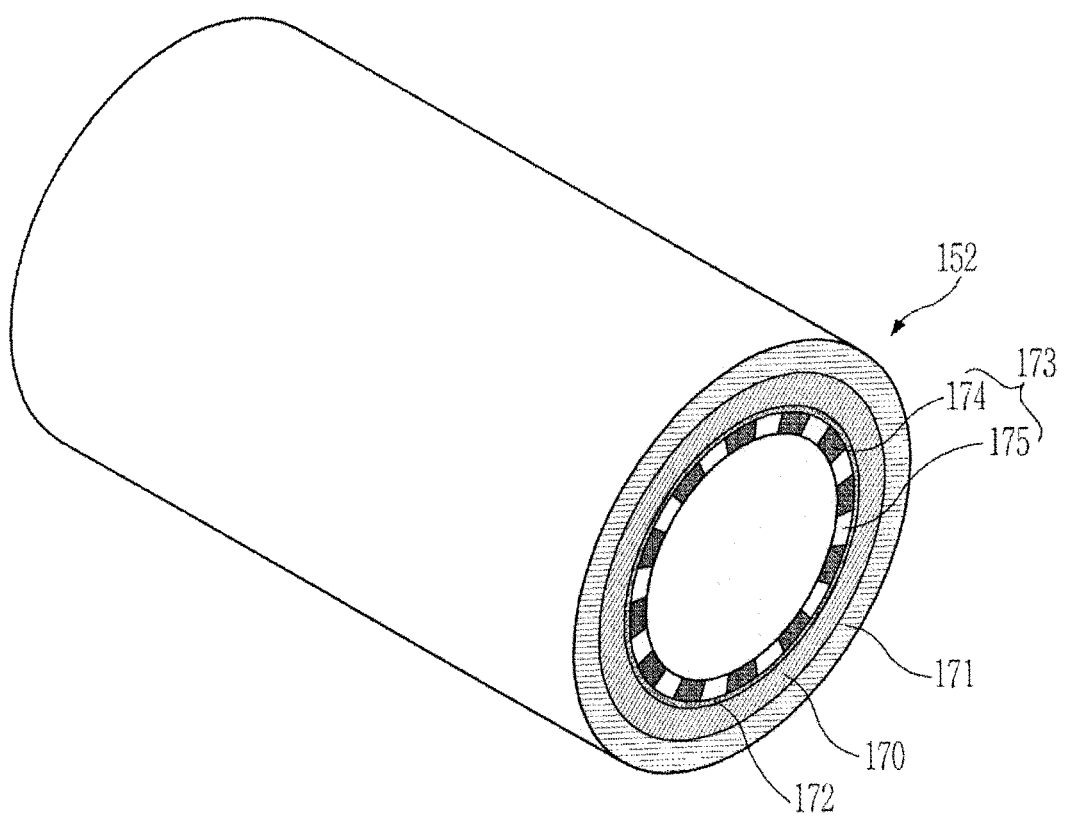
FIGS. 16, 17, and 18 are perspective views conceptually showing the structure of the gradient coil unit shown in FIGS. 13, 14, and 15.
Figure 17:
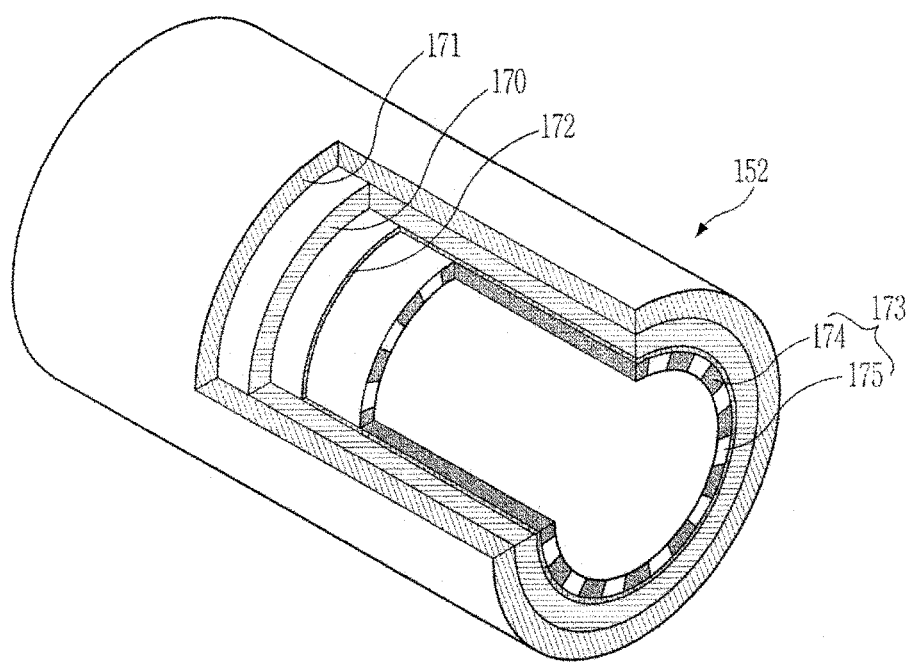
Figure 18:
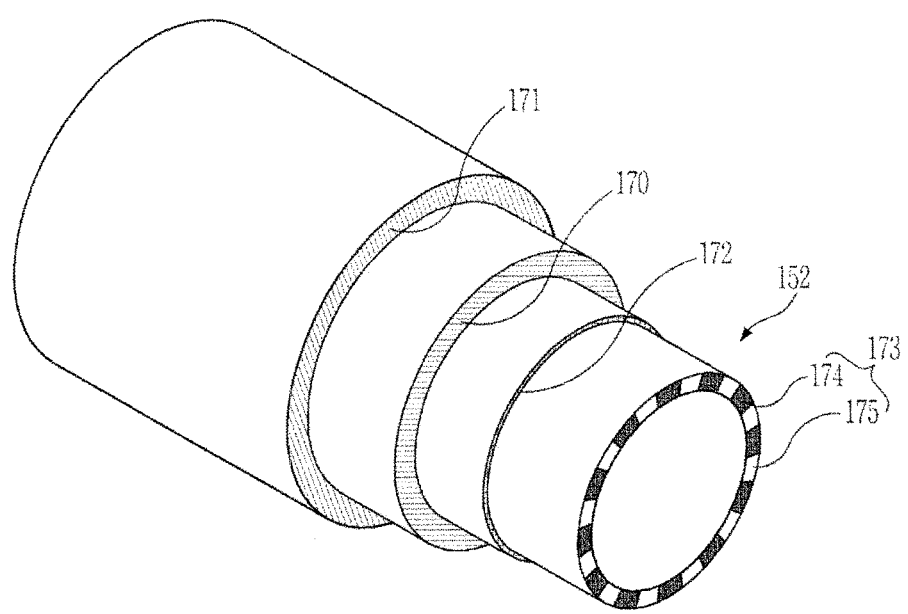

FIGS. 13, 14, and 15 are cross-sectional views conceptually showing the structure of a gradient coil unit 152 of a MRI apparatus according to another exemplary embodiment of the present invention, and FIGS. 16, 17, and 18 are perspective views conceptually showing the structure of the gradient coil unit 152 shown in FIGS. 13, 14, and 15.

The gradient coil unit 152 applies a gradient to a static field formed in cavity to form a gradient field.

As described above, in order to obtain 3D spatial information, gradient fields with respect to all of the x-, y-, and z-axes are required, and accordingly, the gradient coil unit 152 includes three pairs of gradient coils.

As shown in FIG. 13, the gradient coil unit 152 includes shield coils 171 provided outside the gradient coils 170.

As shown in the drawings, since the shield coils 171 are disposed outside the gradient coils 170, the installation radius of the shield coils 171 is larger than that of the gradient coils 170.

If a strong pulse of current is applied to the gradient coils 170, an eddy current flows through a static coil unit surrounding the gradient coils 170 in a direction in which generation of a gradient field is suppressed. The eddy current causes problems as previously-described herein above.

In order to overcome the problems due to eddy current, the shield coils 171 are installed outside the gradient coils 170. In order to cancel the strength of gradient fields extending out of the gradient coils 170 to thus reduce the amount of eddy current, a current whose direction is opposite to that of current applied to the gradient coils 170 is applied to the shield coils 171.

In the current exemplary embodiment, the MRI apparatus includes shims provided in the gradient coil unit 152 in order to uniformly distribute a static field that is formed by a static coil unit.

As shown in FIG. 13, the shims 173 are provided in the innermost part of the gradient coil unit 152. In other words, the installation radius of the shims 173 is shorter than the installation radius of the gradient coils 170. There are active shims and passive shims, and in the current exemplary embodiment, passive shims are used.

The shims 173 are configured with iron tokens for homogeneity of the static field, and shim trays 174 into which the iron tokens are accommodated. The shim trays 174 have a length corresponding to the length in z-axis direction of the gradient coil unit 152 which is in the shape of a cylinder, and the inner space of each shim tray 174 may be partitioned into a plurality of spaces according to the sizes of iron tokens so that a plurality of iron tokens can be accommodated in the shim tray 174.

The shim trays 174 are installed by being inserting into shim inserting parts 176 separately provided along the inner circumference direction of the gradient coil unit 152.

A basic principle in which the shims 173 uniformly form a static field is well-known in the art, and accordingly, a detailed description thereof will be omitted.

With continued reference to FIG. 13, when a current is applied to the gradient coils 170 or the shield coils 171, heat is generated due to resistance of the coils, and the generated heat raises the temperature of the shim iron tokens.

Since a change in temperature of the iron tokens acts as a factor that changes homogeneity of the static field, a cooler 172 is needed for cooling the being transferred to the iron tokens to prevent the temperature of the iron tokens from being raised.

In a conventional arrangement, the shims 173 are installed between the gradient coils 170 and the shield coils 171 of the gradient coil unit 152. However, in the present case according to the present invention, since heat generated from the gradient coils 170 and the shield coils 171 is transferred to the shims 173 in both directions, two coolers should be installed such that one cooler would be installed adjacent to the gradient coils 170 and another cooler would be installed adjacent to the shield coils 171.

As such, when two coolers are installed, the section thickness of the gradient coil unit 152 increases, which limits a design degree of freedom.

The spaces between the shim trays 174 are filled with resin such as epoxy, and the resin acts as pillars supporting the gradient coils 170 and the shield coils 171. However, the Lorentz force is applied in all directions to the resin filled in the spaces between the shim trays 174 according to flow of current in the gradient coils 170 and the shield coils 171, so that a problem of structural instability may occur.

In other words, when the shims 173 are installed between the gradient coils 170 and the shield coils 171, the section thickness of the gradient coil unit 152 is thickened, and also a problem of structural instability can occur.

Accordingly, in the gradient coil unit 152 of the MRI apparatus according to the present exemplary embodiment of the invention, by installing shims 173 in the innermost part of the gradient coil unit 152, the above-described problems are overcome.

The present example such as shown in FIG. 13 arranges shims 173 in the innermost part of the gradient coil unit 152, instead of the outermost part of the gradient coil unit 152.

If the shims 173 are installed in the innermost part of the gradient coil unit 152, heat is transferred in one direction to the shim iron tokens. More particularly, a direction in which heat is transferred to the iron tokens is limited to the direction toward the center of the cylinder.

As a result, since heat is transferred in one direction, only a single cooler 172 is arranged between the gradient coils 170 and the shims 173.

FIG. 13 shows the case in which the cooler 172 has been installed between the gradient coils 170 and the shims 173. The cooler 172 may use various well-known cooling methods.

Since only the single cooler 172 is utilized by installing the shims 173 in the innermost part of the gradient coil unit 152, the section thickness of the gradient coil unit 152 is thinner than that of when two coolers are used.

The reduced thickness may contribute to an increase of a degree of freedom in manufacturing of the gradient coil unit 152 and in designing and manufacturing of the MRI apparatus.

Also, by installing the shims 173 in the innermost part of the gradient coil unit 152, influence of the Lorentz force is limited to one direction compared to when the shims 173 are installed between the gradient coils 170 and the shield coils 171, and thus the present invention contributes to structural stability.

Also, when the shims 173 are installed between the gradient coils 170 and the shield coils 171 in a conventional device, the shim inserting parts 176 into which the shim trays 174 are inserted for structural stability of the gradient coil unit 152 should be arranged at regular intervals. As described above, since the resin filled between the shim inserting parts 176 acts as pillars supporting the gradient coils 170 and the shield coils 171, the shim inserting parts 176 should be formed at regular intervals for structural stability of the gradient coil unit 152.

However, if the shims are installed in the innermost part of the gradient coil unit 152, as in the current example of the present invention, it is unnecessary to arrange the shim inserting parts 176 at regular intervals for structural stability. Accordingly, the shim inserting parts 176 may be arranged at irregular intervals, as shown in FIG. 14.

Moreover in addition to the shim inserting parts being arranged at irregular intervals, the intervals between the shims 173 can be freely designed, advantageously permitting homogeneity of a static field can be finely adjusted.

FIG. 15 shows another exemplary embodiment of the present invention.

Referring now to FIG. 15, the width "d" of the shim inserting parts 176 may be designed to be wider "e" than the width e of the shim trays 174 that are inserted into the shim inserting parts 176 so that the shim trays 174 inserted into the shim inserting parts 176 can move in the width direction.

Accordingly, by enabling the shim trays 174 to move in some degree in the circumferential direction, while uniformly forming a static field by adjusting the number or arrangement of iron tokens accommodated in the shim trays 174, high homogeneity of the static field can be achieved.

FIG. 16 is a perspective view 3-dimensionally illustrating the gradient coil unit 152 shown in FIG. 13, FIG. 17 is a perspective view showing the internal structure of the gradient coil unit 152, and FIG. 18 is a perspective view for showing that the individual components of the gradient coil unit 152 have different radiuses of cylinder structures.

Referring to FIGS. 15, 16 and 17, the gradient coil unit 152 includes shims 173 positioned in the innermost art of the gradient coil unit 152 and has an installation radius "f", gradient coils 170 surrounding the shims 173 and having an installation radius "g" longer than the installation radius "f" of the shims 173, and shield coils 171 surrounding the gradient coils 170 and having an installation radius h longer than the installation radius g of the gradient coils 170. Also, a cooler 172 is positioned between the shims 173 and the gradient coils 170 in order to prevent the temperature of the shim iron tokens from being raised.

Figure 19:
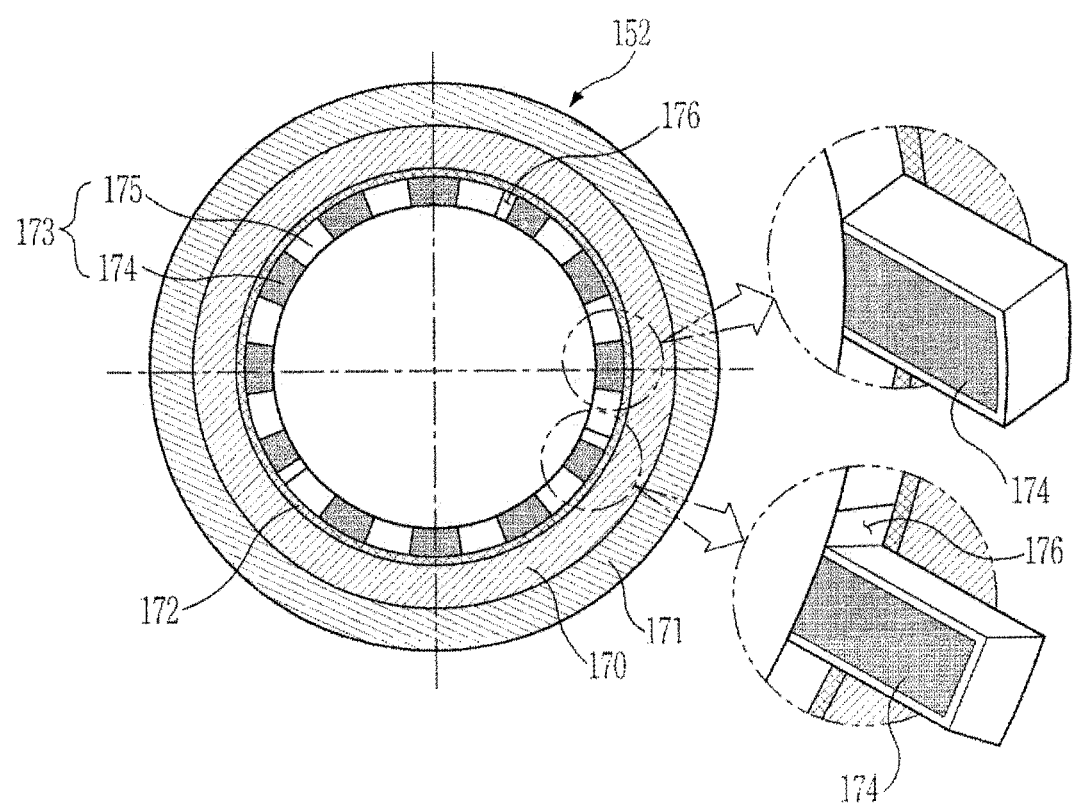
FIG. 19 is a perspective view conceptually showing shims of the gradient coil unit shown in FIGS. 13, 14, and 15 and the structure of a cooling unit.

FIG. 19 shows the shims 173 and the cooler 172 in detail.

Referring now to FIG. 19, it is seen that the cooler 172 is installed in contact with the outer surfaces of the shims 173. Since the shims 173 are disposed in the innermost part of the gradient coil unit 152 so that a direction in which the transference of heat generated from the gradient coils 170 and the shield coils 171 is limited to the direction toward the center of the cylinder, in this example only a single cooler 172 is provided on the outer surfaces of the shims 173.

The shims 173 shown in FIG. 19 may be arranged as shown in FIGS. 13, 14, and 15. In other words, some of the shims 173 may be arranged at regular intervals, some others of the shims 173 may be arranged at irregular intervals, and in some shims 173, the widths of the corresponding shim inserting parts 176 may be wider than those of the corresponding shim trays 174.

As shown in an enlarged part of FIG. 19, a corresponding one of shims arranged at regular intervals, in which each shim 173 is configured with a drawer-type shim tray 174 that is inserted into a shim inserting part 176, and one or more iron tokens (not shown) that are accommodated into the shim tray 174. The number or arrangement of the iron tokens that are accommodated into the shim tray 174 is determined according to results calculated for homogeneity of a static field.

The other enlarged part in FIG. 19 shows an area in which the width of the shim inserting part 176 is wider than that of the shim tray 174. As described above with reference to FIG. 15, if the widths d of shim inserting parts 176 are designed to be wider than the widths e of the corresponding shim trays 174, the shim trays 174 inserted into the shim inserting parts 176 may move in the width direction. Accordingly, by enabling the shim trays 174 to move in some degree in the circumferential direction, while uniformly forming a static field by adjusting the number or arrangement of iron tokens accommodated in the shim trays 174, high homogeneity of the static field can be achieved.

Figure 20:
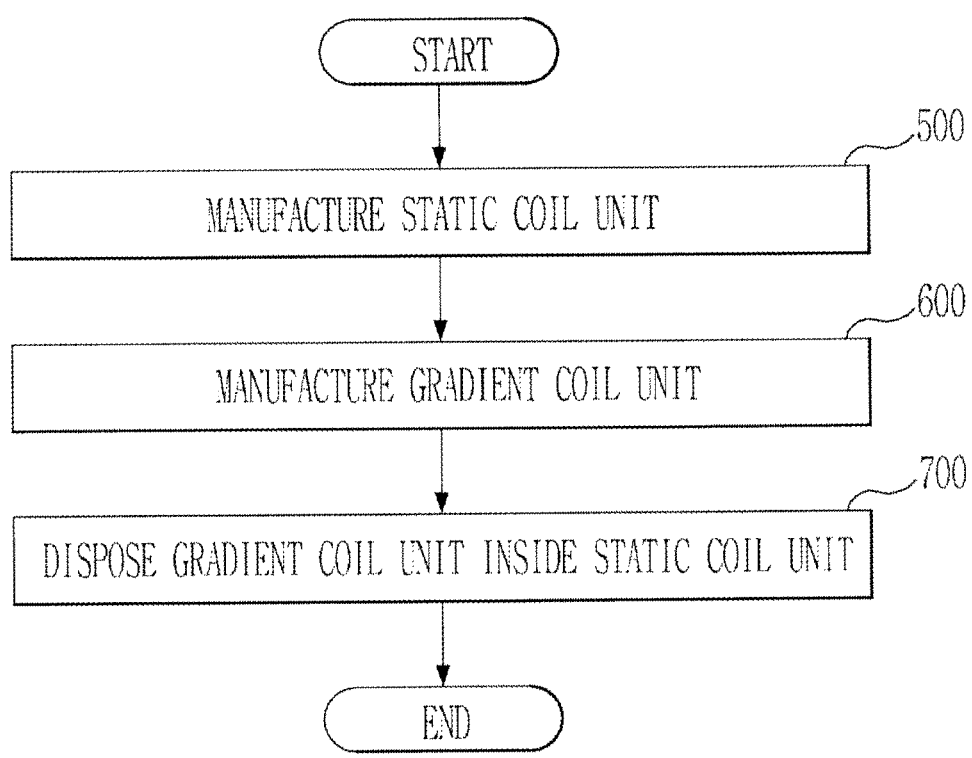
FIG. 20 is a flowchart showing exemplary operation of a manufacturing method of an MRI apparatus, in accordance with an exemplary embodiment of the present invention.

FIG. 20 is a flowchart showing exemplary operation of a manufacturing method of a MRI apparatus, in accordance with an exemplary embodiment of the present invention.

Referring now to FIG. 20, first, a static coil unit is manufactured (500), a gradient coil unit (152 of FIG. 2) is manufactured (600), and then the gradient coil unit 152 is disposed inside the static coil unit (700), thereby manufacturing the MRI apparatus.

Operation of manufacturing the static coil unit and operation of disposing the gradient coil unit inside the gradient coil unit which in the shape of a cylinder can be performed by various methods well-known in the art, and accordingly, detailed descriptions thereof will be omitted.

Figure 21:
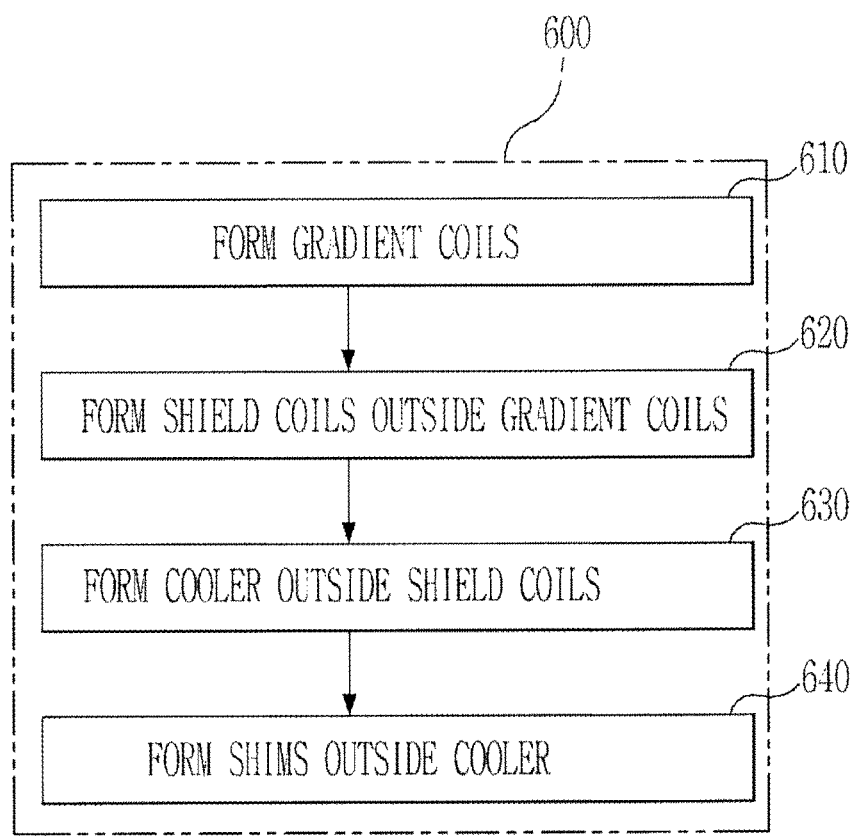
FIG. 21 is a flowchart showing exemplary operation of a manufacturing method of a gradient coil unit, in accordance with an exemplary embodiment of the present invention.

FIG. 21 is a flowchart showing exemplary operation of a manufacturing method of the gradient coil unit 152 of FIG. 20 in detail, in accordance with an exemplary embodiment of the present invention.

Hereinafter, the manufacturing method of the gradient coil unit 152 will be described in detail with reference to FIG. 21.

First, at (S610) gradient coils for forming gradient fields in a static field are formed, and at (S620) shield coils 171 are formed outside the gradient coils 170.

In order to obtain 3D spatial information about a subject, gradient fields with respect to all of x-, y-, and z-axes are required, and accordingly, the gradient coil unit 152 includes three pairs of gradient coils.

As shown in FIGS. 4 and 5, z-axis gradient coils 154 is configured with a pair of ring-shaped coils, and y-axis gradient coils 155 are positioned above and below the subject 200. Also, x-axis gradient coils 156 are positioned in the left and right sides of the subject 200. As such, gradient coils having three axes are manufactured.

Then, shield coils 171 having an installation radius longer than the installation radius of the gradient coils 170 are installed outside the gradient coils 170.

If a strong pulse of current is applied to the gradient coils 170, an eddy current flows through a static coil unit surrounding the gradient coils 170 in a direction in which generation of a gradient field is suppressed. The eddy current acts as a factor of degrading image quality as described above.

In order to overcome the problem due to eddy current, the shield coils 171 are installed outside the gradient coils 170. In order to cancel the strength of gradient fields extending out of the gradient coils 170 to thus reduce the amount of eddy current, a current whose direction is opposite to that of current applied to the gradient coils 170 is applied to the shield coils 171.

After the shield coils 171 are formed, then at (630)_a cooler 172 is formed outside the shield coils 171, and at (640) shims 173 are formed outside the cooler 172.

In order to form the shims 173 outside the shield coils 171, shim inserting parts 176 are separately formed along the outer circumference direction of the shield coils 171, and the shims 173 are inserted into the shim inserting parts 176.

The shim inserting parts 176 may be, as shown in FIG. 6, formed at regular intervals, or may be, as shown in FIG. 7, formed at irregular intervals.

If the intervals between the shims 173 can be freely designed, homogeneity of the static field can be finely adjusted.

As shown in FIG. 8, the width "d" of the shim inserting parts 176 may be designed to be wider than the width e of the shim trays 174 that are inserted into the shim inserting parts 176 so that the shim trays 174 inserted into the shim inserting parts 176 can move in the width direction.

Accordingly, by designing the width d of the shim inserting parts 176 to be wider than the width "e" of the shim trays 174 to thereby enable the shim trays 174 to move in some degree in the circumference direction, while uniformly forming a static field by adjusting the number or arrangement of iron tokens accommodated in the shim trays 174, high homogeneity of a static field can be achieved.

As shown in FIG. 12, the cooler 172 is installed in contact with the inner surfaces of the shims 173, that is, between the shield coils 171 and the shims 173. Since the shims 173 are disposed in the most outer part of the gradient coil unit 152 so that a direction in which heat generated from the gradient coils 170 and the shield coils 171 is transferred is limited to the direction from the center of the cylinder to the outside, only a cooler 172 is provided on the inner surfaces of the shims 173.

Figure 22:
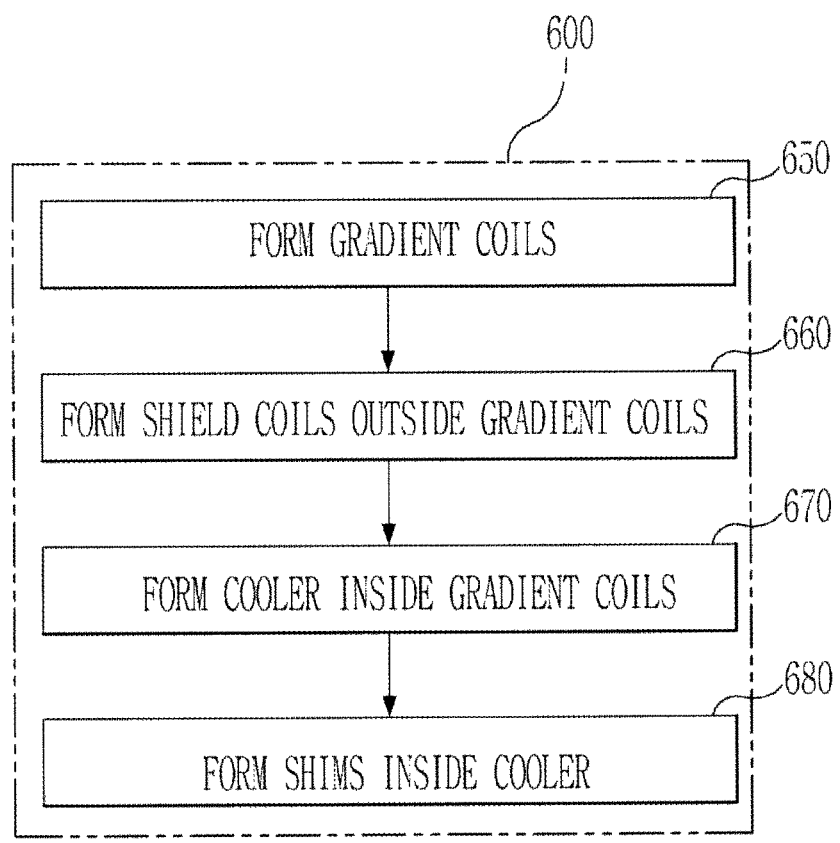
FIG. 22 is a flowchart showing exemplary operation of a manufacturing method of a gradient coil unit, in accordance with another exemplary embodiment of the present invention.

FIG. 22 is a flowchart showing a manufacturing method of a gradient coil unit 152 in detail, in accordance with another embodiment of the present invention.

Referring now to FIG. 22, at (650) gradient coils 170 for forming gradient fields in a static field are formed, and at (660) shield coils 171 are formed outside the gradient coils 170.

In order to obtain 3D spatial information about a subject, gradient fields with respect to all of x-, y-, and z-axes are required, and accordingly, the gradient coil unit 152 includes three pairs of gradient coils.

As shown in FIGS. 4 and 5, z-axis gradient coils 154 is configured with a pair of ring-shaped coils, and y-axis gradient coils 155 are positioned above and below the subject 200. Also, x-axis gradient coils 156 are positioned in the left and right sides of the subject 200. As such, gradient coils having three axes are manufactured.

Then, shield coils 171 having an installation radius longer than the installation radius of the gradient coils 170 are installed outside the gradient coils 170.

If a strong pulse of current is applied to the gradient coils 170, an eddy current flows through a static coil unit surrounding the gradient coils 170 in a direction in which generation of a gradient field is suppressed. The eddy current acts as a factor of degrading image quality as described above.

In order to overcome the problem due to eddy current, the shield coils 171 are installed outside the gradient coils 170. In order to cancel the strength of gradient fields extending out of the gradient coils 170 to thus reduce the amount of eddy current, current whose direction is opposite to that of current applied to the gradient coils 170 is applied to the shield coils 171.

After the gradient coils 170 and the shield coils 171 are formed, at (670) a cooler 172 is formed inside the gradient coils 170, and at (680) shims 173 are formed inside the cooler 172.

In order to form the shims 173 inside the gradient coils 170, shim inserting parts 176 are separately formed along the inner circumference direction of the gradient coils 170, and the shims 173 are inserted into the shim inserting parts 176.

The shim inserting parts 176 may be, as shown in FIG. 13, formed at regular intervals, or may be, as shown in FIG. 14, formed at irregular intervals.

If the intervals between the shims 173 can be freely designed, homogeneity of the static field can be finely adjusted.

As shown in FIG. 15, the width "d" of the shim inserting parts 176 may be designed to be wider than the width "e" of the shim trays 174 that are inserted into the shim inserting parts 176 so that the shim trays 174 inserted into the shim inserting parts 176 can move in the width direction.

Accordingly, by designing the width "d" of the shim inserting parts 176 to be wider than the width e of the shim trays 174 to thereby enable the shim trays 174 to move in some degree in the circumference direction, while uniformly forming a static field by adjusting the number or arrangement of iron tokens accommodated in the shim trays 174, high homogeneity of the static field can be achieved.

As shown in FIG. 19, the cooler 172 is installed in contact with the outer surfaces of the shims 173, that is, between the gradient coils 170 and the shims 173. Since the shims 173 are disposed in the most inner part of the gradient coil unit 152 so that a direction in which heat generated from the gradient coils 170 and the shield coils 171 is transferred is limited to the direction toward the center of the cylinder, only a cooler 172 is provided on the outer surfaces of the shims 173.

The above-described methods according to the present invention can be implemented in hardware, firmware or as software or computer code that configures hardware for operation, and is stored on a non-transitory machine readable medium such as a CD ROM, DVD, RAM, a floppy disk, a hard disk, or a magneto-optical disk, such as a floptical disk or computer code downloaded over a network originally stored on a remote recording medium or a non-transitory machine readable medium and stored on a local non-transitory recording medium, so that the methods described herein can be loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor" or "microprocessor" comprises hardware in the claimed invention. Under the broadest reasonable interpretation, the appended claims constitute statutory subject matter in compliance with 35 U.S.C. §101. The terms "unit" or "module" as used herein is to be understood under the broadest reasonable interpretation as constituting statutory subject matter under 35 U.S.C. §101 that includes hardware and does not constitute software per se. When a unit or module includes machine executable code it is to be understood that a non-transitory machine readable medium contains the machine executable code that is loaded into hardware such as a processor or controller for execution and configures the processor or controller for operation.

Although a few exemplary embodiments of the present invention have been shown and described, those skilled in the art will understand and appreciate that various changes may be made to these exemplary embodiments without departing from the principles and spirit of the invention, the scope of which is defined in the claims and their equivalents.

What is claimed is:

1. A magnetic resonance imaging (MRI) apparatus comprising:
    a static coil unit configured to form a static field in a subject;
    a gradient coil unit configured to form a gradient field in the static field, wherein the gradient coil unit includes one or more shims arranged in an outermost part of the gradient coil unit to provide homogeneity of the static field formed by the static coil unit; and
    a cooler formed inside the shims, wherein the cooler is configured to prevent a temperature of the shims from being raised at least beyond a threshold temperature by heat transferred to the shims.

2. The MRI apparatus according to claim 1, wherein the gradient coil unit includes:
    gradient coils configured to form the gradient field in the static field; and
    shield coils formed along an exterior of the gradient coils, and configured to compensate for influence of an eddy current induced in the static coil unit by the gradient coils.

3. The MRI apparatus according to claim 2, wherein an installation radius of the shield coils arranged along the exterior of the gradient coils is larger than an installation radius of the gradient coils.

4. The MRI apparatus according to claim 2, wherein the shims are positioned along an exterior of the shield coils, in the gradient coil unit.

5. The MRI apparatus according to claim 2, wherein the cooler is formed between the shield coils and the shims.

6. The MRI apparatus according to claim 1, wherein the shims include:
    one or more shim trays configured to be inserted into one or more shim inserting parts separately formed along an outer circumferential direction of the gradient coil unit; and
    one or more tokens configured to be accommodated in the shim trays.

7. The MRI apparatus according to claim 6, wherein the tokens comprise iron tokens.

8. The MRI apparatus according to claim 6, wherein at least one of intervals between the shims arranged in the outermost part of the gradient coil unit is different from remaining intervals.

9. The MRI apparatus according to claim 6, wherein at least one of the shim inserting parts has a longer length in circumferential direction of a section perpendicular to a central axis of the gradient coil unit, than a length in a circumferential direction of a section of a shim tray inserted into the corresponding shim inserting part.

10. A magnetic resonance imaging (MRI) apparatus comprising:
- a static coil unit configured to form a static field in a subject;
- a gradient coil unit configured to form a gradient field in the static field, wherein the gradient coil unit includes one or more shims in an innermost part of the gradient coil unit to provide homogeneity of the static field formed by the static coil unit and
- a cooler formed inside the shims, wherein the cooler is configured to prevent a temperature of the shims from being raised at least beyond a threshold temperature by heat transferred to the shims.

11. The MRI apparatus according to claim 10, wherein the gradient coil unit includes:
- gradient coils configured to form the gradient field in the static field; and
- shield coils formed along an exterior of the gradient coils, and configured to compensate for influence of an eddy current induced in the static coil unit by the gradient coils.

12. The MRI apparatus according to claim 11, wherein an installation radius of the shield coils arranged along the exterior of the gradient coils is larger than an installation radius of the gradient coils.

13. The MRI apparatus according to claim 11, wherein the shims are positioned inside the shield coils, in the gradient coil unit.

14. The MRI apparatus according to claim 11, wherein the cooler is formed between the shield coils and the shims.

15. The MRI apparatus according to claim 11, wherein the shims include:
- one or more shim trays configured to be inserted into one or more shim inserting parts separately formed along an inner circumference direction of the gradient coil unit; and
- one or more tokens configured to be accommodated in the shim trays.

16. The MRI apparatus according to claim 15, wherein the tokens comprise iron tokens.

17. The MRI apparatus according to claim 15, wherein at least one of intervals between the shims is different from remaining intervals.

18. The MRI apparatus according to claim 15, wherein at least one of the shim inserting parts has a longer length in a circumferential direction of a section perpendicular to a central axis of the gradient coil unit, than a length in a circumferential direction of a section of a shim tray inserted into the corresponding shim inserting part.

19. A manufacturing method of a magnetic resonance imaging (MRI) apparatus, comprising:
- manufacturing a static coil unit;
- manufacturing a gradient coil unit by installing one or more shims in an outermost part of the gradient coil unit;
- disposing the gradient coil unit inside the static coil unit; and
- forming a cooler inside the shims.

20. The manufacturing method according to claim 19, wherein the manufacturing of the gradient coil unit comprises:
- forming gradient coils;
- forming shield coils outside the gradient coils; and
- forming the shims outside the shield coils.

21. The manufacturing method according to claim 20, wherein the cooler is formed between the shield coils and the shims.

22. The manufacturing method according to claim 20, wherein the forming of the shims comprises forming one or more shim inserting parts separately along an outer circumferential direction of the shield coils, outside the shield coils; and
- inserting the shims into the shim inserting parts.

23. The manufacturing method according to claim 22, wherein the forming of the shim inserting parts comprises forming the shim inserting parts such that at least one of intervals between the shim inserting parts is different from remaining intervals.

24. The manufacturing method according to claim 22, wherein the forming of the shim inserting parts comprises forming the shim inserting parts such that a length in a circumferential direction of a section of at least one shim inserting part perpendicular to a central axis of the gradient coil unit is longer than a length in a circumferential direction of a section of a shim tray inserted into the corresponding shim inserting part.

25. A manufacturing method of a magnetic resonance imaging (MRI) apparatus, comprising:
- manufacturing a static coil unit;
- manufacturing a gradient coil unit by installing one or more shims in an innermost part of the gradient coil unit;
- disposing the gradient coil unit inside the static coil unit; and
- forming a cooler inside the shims.

26. The manufacturing method according to claim 25, wherein the manufacturing of the gradient coil unit comprises:
- forming gradient coils;
- forming shield coils outside the gradient coils; and
- forming the shims inside the gradient coils.

27. The manufacturing method according to claim 26, wherein the cooler is formed between the shield coils and the shims.

28. The manufacturing method according to claim 26, wherein the forming of the shims comprises:
- forming one or more shim inserting parts separately along an inner circumferential direction of the gradient coils, inside the gradient coils; and
- inserting the shims into the shim inserting parts.

29. The manufacturing method according to claim 28, wherein the forming of the shim inserting parts comprises forming the shim inserting parts such that at least one of intervals between the shim inserting parts is different from remaining intervals.

30. The manufacturing method according to claim 28, wherein the forming of the shim inserting parts comprises forming the shim inserting parts such that a length in the circumferential direction of a section of at least one shim inserting part perpendicular to a central axis of the gradient coil unit is longer than a length in a circumferential direction of a section of a shim tray inserted into the corresponding shim inserting part.

* * * * *